United States Patent
You et al.

(10) Patent No.: US 9,202,850 B2
(45) Date of Patent: Dec. 1, 2015

(54) ORGANIC LIGHT-EMITTING DISPLAY APPARATUS

(71) Applicant: SAMSUNG DISPLAY CO., LTD., Yongin, Gyeonggi-do (KR)

(72) Inventors: Jae-Ho You, Yongin (KR); Myung-Im Kim, Yongin (KR); Seung-Won Park, Yongin (KR); Lei Xie, Yongin (KR); Moon-Gyu Lee, Yongin (KR); Su-Mi Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/153,960

(22) Filed: Jan. 13, 2014

(65) Prior Publication Data

US 2015/0041768 A1 Feb. 12, 2015

(30) Foreign Application Priority Data

Aug. 12, 2013 (KR) .......................... 10-2013-0095607

(51) Int. Cl.
*H01L 27/32* (2006.01)
*H01L 51/52* (2006.01)
*H01L 51/50* (2006.01)

(52) U.S. Cl.
CPC .......... *H01L 27/326* (2013.01); *H01L 51/5271* (2013.01); *H01L 27/3211* (2013.01); *H01L 51/504* (2013.01); *H01L 2251/5323* (2013.01)

(58) Field of Classification Search
CPC .............. H01L 27/3276; H01L 27/326; H01L 27/3246; H01L 51/5271
USPC .................................. 257/40, 72, 91, E33.064
See application file for complete search history.

(56) References Cited

U.S. PATENT DOCUMENTS 7,423,809 B2   9/2008   Oshima et al.
7,425,794 B2 *  9/2008   Adachi .......................... 313/112
(Continued)

FOREIGN PATENT DOCUMENTS

JP   2004-004968   1/2004
JP     3651611    3/2005
(Continued)

OTHER PUBLICATIONS

US Patent Application Publication No. 2009/0040440 (for KR10-0976700).
(Continued)

*Primary Examiner* — Mamadou Diallo
*Assistant Examiner* — Christina Sylvia
(74) *Attorney, Agent, or Firm* — F. Chau & Associates, LLC

(57) ABSTRACT

An organic light-emitting display apparatus includes a first emission portion and an optical member. The first emission portion emits light of a first color, and includes a first intermediate layer, a first electrode that is disposed on one surface of the first intermediate layer and transmits light emitted from the first intermediate layer, and a second electrode that is disposed on another surface of the first intermediate layer facing the one surface of the first intermediate layer and transmits the light emitted from the first intermediate layer. The optical member is disposed on one surface of the first emission portion and selectively reflects light of particular colors including at least the first color light.

18 Claims, 8 Drawing Sheets

(56) References Cited

U.S. PATENT DOCUMENTS

| | | |
|---|---|---|
| 2005/0035353 A1* | 2/2005 | Adachi et al. ............... 257/72 |
| 2009/0040440 A1 | 2/2009 | Park |
| 2011/0114974 A1* | 5/2011 | Song et al. ............... 257/89 |
| 2011/0220908 A1 | 9/2011 | Kim et al. |
| 2012/0153321 A1 | 6/2012 | Chung et al. |

FOREIGN PATENT DOCUMENTS

| | | |
|---|---|---|
| JP | 2006-106570 | 4/2006 |
| JP | 2006-178261 | 7/2006 |
| JP | 2011-022432 | 2/2011 |
| JP | 4760011 | 6/2011 |
| KR | 10-2009-0015318 | 2/2009 |
| KR | 10-0976700 | 8/2010 |
| KR | 10-2011-0102000 | 9/2011 |
| KR | 10-2012-0069312 | 6/2012 |

OTHER PUBLICATIONS

US Patent Application Publication No. 2011/0220908 (for KR10-2011-0102000).

US Patent Application Publication No. 2012/0153321 (for KR10-2012-0069312).

Jinkoo Chung, et al., "Transparent AMOLED Display Based on Bottom Emission Structure," SID 10 Digest, pp. 148-151, 2010.

Frank S. Bates, et al., "Block Copolymers-Designers Soft Materials," Physics Today, Feb. 1999, pp. 32-38.

\* cited by examiner

ORGANIC LIGHT-EMITTING DISPLAY APPARATUS

RELATED APPLICATIONS

This application claims priority to Korean Patent Application No. 10-2013-0095607, filed on Aug. 12, 2013, in the Korean Intellectual Property Office, the disclosure of which is herein incorporated by reference in its entirety.

TECHNICAL FIELD

The present disclosure relates to a display apparatus and, more specifically, to an organic light-emitting display apparatus.

DISCUSSION OF THE RELATED ART

An organic light-emitting display apparatus is a self-luminous display apparatus which includes a plurality of organic light-emitting devices. Each of the organic light-emitting devices includes a hole injection electrode, an electron injection electrode, and an organic emission layer provided therebetween. An exciton is generated when a hole injected from the hole injection electrode is recombined with an electron injected from the electron injection electrode in the organic emission layer. Light is emitted when the exciton falls from an excited state to a ground state.

Since the organic light-emitting display apparatus is a self-luminous display apparatus, a separate light source is unnecessary. Therefore, the organic light-emitting display apparatus may be driven at a relatively low voltage and may be manufactured to have a light weight and a slim profile. In addition, the organic light-emitting display apparatus has high-grade characteristics, such as wide viewing angles, high contrast, and fast response times. Hence, the organic light-emitting display apparatus has been widely applied to various fields, including personal portable devices such as media players including MP3 players, mobile phones including smartphones, televisions (TVs), and the like.

Moreover, the organic light-emitting display apparatus may be implemented as a transparent organic light-emitting display apparatus including a transparent region in at least a portion thereof.

SUMMARY

According to one or more exemplary embodiments of the present invention, an organic light-emitting display apparatus includes a first emission portion including a first intermediate layer. A first electrode is disposed on one surface of the first intermediate layer and transmits light emitted from the first intermediate layer. A second electrode is disposed on another surface of the first intermediate layer facing the one surface of the first intermediate layer and transmits the light emitted from the first intermediate layer. The first emission portion is configured to emit light of a first color. An optical member is disposed on one surface of the first emission portion and selectively reflects light of particular colors including at least the first color.

The organic light-emitting display apparatus may further include a second emission portion that is disposed adjacent to the first emission portion, without overlapping the first emission portion, and may include a second intermediate layer. The second emission portion is configured to emit light of a second color. A third emission portion is disposed adjacent to the second emission portion, without overlapping the first emission portion and the second emission portion, and may include a third intermediate layer. The third emission portion is configured to emit light of a third color. The optical member extends from the first emission portion to the second emission portion and the third emission portion, and selectively reflects the light of the first color, the light of the second color, and the light of the third color.

The first electrode may include indium tin oxide (ITO), indium zinc oxide (IZO), zinc oxide (ZnO), indium oxide ($In_2O_3$), indium gallium oxide (IGO), and/or aluminum zinc oxide (AZO) as a material transmitting the light emitted from the first emission portion. The second electrode may include a magnesium (Mg) thin film, a silver (Ag) thin film, and/or an Mg:Ag thin film as a material transmitting the light emitted from the first emission portion.

A substrate may be disposed between the first electrode and the optical member.

A substrate may be disposed on an opposite surface to a surface of the first electrode where the first intermediate layer is disposed, and the optical member may be disposed between the first electrode and the substrate.

A thin film transistor (TFT) array substrate may be disposed on an opposite surface to a surface of the first electrode where the first intermediate layer is disposed. The TFT array substrate may include a transparent substrate and a circuit portion. The circuit portion may be disposed on the transparent substrate and may include a TFT. The optical member may be disposed between the transparent substrate and the circuit portion.

A TFT array substrate may be disposed on an opposite surface to a surface of the first electrode where the first intermediate layer is disposed, and the optical member may be disposed on an opposite surface to a surface of the second electrode where the first intermediate layer is disposed.

The optical member may include a first color light reflection portion, a second color light reflection portion, and a third color light reflection portion.

The organic light-emitting display apparatus may further include a first circuit portion, a second circuit portion, and a third circuit portion electrically connected to the first emission portion, the second emission portion, and the third emission portion, respectively. The first circuit portion, the second circuit portion, and the third circuit portion may be disposed not to overlap the first emission portion, the second emission portion, or the third emission portion.

The organic light-emitting display apparatus may further include a first circuit portion, a second circuit portion, and a third circuit portion electrically connected to the first emission portion, the second emission portion, and the third emission portion, respectively. The first circuit portion, the second circuit portion, and the third circuit portion may be disposed to overlap the first emission portion, the second emission portion, and the third emission portion, respectively.

The organic light-emitting display apparatus may further include a first transmission portion that is disposed between the first emission portion and the second emission portion and transmits external light. A second transmission portion may be disposed between the second emission portion and the third emission portion and may emit external light.

The second electrode may extend to regions corresponding to the second emission portion, the third emission portion, the first transmission portion, and the second transmission portion.

The second electrode may extend to regions corresponding to the second emission portion and the third emission portion, and may include openings corresponding to the first transmission portion and the second transmission portion.

The optical member may include a high refractive index layer and a low refractive index layer that are alternately stacked.

The high refractive index layer and the low refractive index layer may have a refractive index of about 1.3 to about 2.3, and a difference of the refractive index between the high refractive index layer and the low refractive index layer may be in the range of about 0.1 to about 1.

The optical member may include a block copolymer.

The block copolymer may be polystyrene-block-poly(methylmethacrylate) (PS-b-PMMA), polystyrene-block-poly(ethylene oxide) (PS-b-PEO), polystyrene-block-poly(vinyl pyridine) (PS-b-PVP), polystyrene-block-poly(ethylene-alt-propylene) (PS-b-PEP), and/or polystyrene-block-polyisoprene (PS-b-PI).

The first color, the second color, and the third color may correspond to a red color, a green color, and a blue color, respectively.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
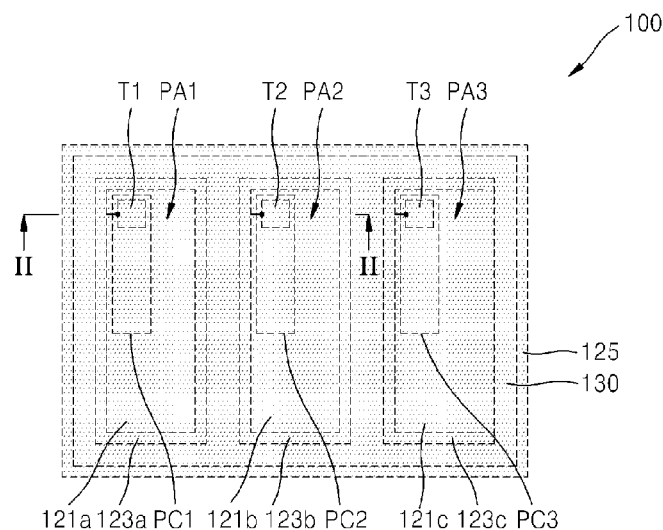
FIG. 1 is a schematic plan view of an organic light-emitting display apparatus according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Throughout the disclosure, like reference numerals may refer to like parts, and a redundant description thereof may therefore be limited or omitted.

It will be understood that although the terms "first", "second", etc. may be used herein to describe various components, these components should not be limited by these terms. These components are only used to distinguish one component from another.

It will be understood that when a layer, region, or component is referred to as being "formed on," another layer, region, or component, it can be directly formed on the other layer, region, or component or intervening elements such as layers, regions and/or components may be present.

Sizes of elements in the drawings may be exaggerated for clarity and convenience of explanation.

Figure 2:
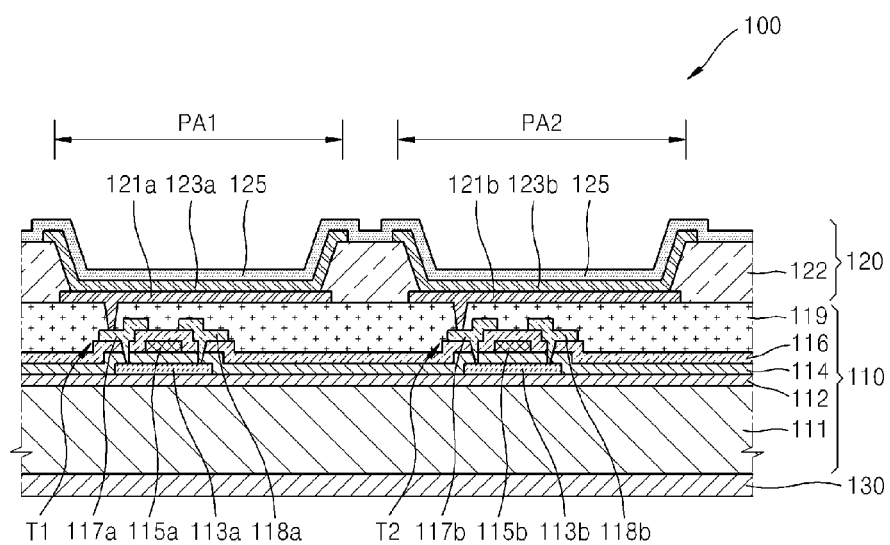
FIG. 2 is a cross-sectional view taken along a line II-II of FIG. 1.

FIG. 1 is a schematic plan view of an organic light-emitting display apparatus 100 according to an exemplary embodiment of the present invention, and FIG. 2 is a cross-sectional view taken along a line II-II of FIG. 1.

Referring to FIGS. 1 and 2, the organic light-emitting display apparatus 100 according to an exemplary embodiment of the present invention may include a first emission portion PA1 emitting light of a first color, a second emission portion PA2 emitting light of a second color, and a third emission portion PA3 emitting light of a third color, all of which may be disposed not to overlap one another. The emission portions PA1, PA2 and PA3 include organic light-emitting devices including first electrodes 121a, 121b and 121c, intermediate layers 123a, 123b and 123c, and second electrodes 125, respectively, which are sequentially disposed on a thin film transistor (TFT) array substrate 110. The emission portions PA1, PA2 and PA3 may be partitioned by pixel defining layers (PDLs) 122.

The first intermediate layer 123a included in the first emission portion PA1, the second intermediate layer 123b included in the second emission portion PA2, and the third intermediate layer 123c included in the third emission portion PA3 each include organic emission layers emitting lights of different colors, respectively. In addition, the intermediate layers 123a, 123b, 123c may further include a hole injection layer (HIL), a hole transport layer (HTL), an electron transport layer (ETL), and/or an electron injection layer (EIL). The embodiment of the present invention is not limited thereto, and the intermediate layers 121a, 121b and 121c may include organic emission layers and various function layers.

Lights emitted from the intermediate layers 123a, 123b and 123c may pass through the first electrodes 121a, 121b and 121c and the second electrodes 125 provided as transparent or translucent electrodes.

The first electrodes 121a, 121b and 121c may include indium tin oxide (ITO), indium zinc oxide (IZO), zinc oxide (ZnO), indium oxide ($In_2O_3$), indium gallium oxide (IGO), and/or aluminum zinc oxide (AZO). The second electrodes 125 may be formed of a metal having a low work function, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or any alloys thereof. In this case, the second electrodes 125 may be formed of high-transmittance thin films that have a thickness range of about 100 Å to about 300 Å.

The first electrodes 121a, 121b and 121c and the second electrodes 125 may each have high transmittance. Therefore, the organic light-emitting display apparatus 100 according to exemplary embodiments of the present invention may have high transmittance with respect to external light.

The organic light-emitting display apparatus 100 according to exemplary embodiment of the present invention includes an optical member 130 disposed under the TFT array substrate 110.

The optical member 130 may reflect only lights of wavelengths corresponding to a first color, a second color, and a third color, and transmit light of the other wavelengths. For example, the light of the first color emitted from the first intermediate layer 123a, the light of the second color emitted from the second intermediate layer 123b, and the light of the third color emitted from the third intermediate layer 123c partially pass through the first electrodes 121a, 121b and 121c and are incident on the TFT array substrate 110, and light passing through the TFT array substrate 110 is incident on the optical member 130.

The optical member 130 functions as a reflection plate with respect to only a particular color to reflect incident light of the particular color, and the reflected light passes through the second electrodes 125. In this manner, an image is displayed.

For example, while some reflection films have been employed in the first electrodes 121a, 121b and 121c or the second electrodes 125 so as to reduce light loss, there has been a limitation in increasing the transmittance of the organic light-emitting display apparatus. However, the organic light-emitting display apparatus 100 according to exemplary embodiments of the present invention employs the optical member 130 that reflects only light of particular wavelengths, without any reflection films. Therefore, the transmittance of the organic light-emitting display apparatus 100 may be increased, and the light loss may be reduced.

The first color, the second color, and the third color may correspond to a red color, a green color, and a blue color, respectively, but the present invention is not limited thereto. For example, various color combinations other than the combination of the red, green and blue colors may be used as long as the colors can combine to produce light that is substantially white.

The TFT array substrate 110 includes a transparent substrate 111, and circuit portions PC1, PC2 and PC3 disposed on the transparent substrate 111 and includes at least one TFT.

The organic light-emitting display apparatus 100 according to exemplary embodiments of the present embodiment may include the first circuit portion PC1, the second circuit portion PC2, and the third circuit portion PC3 electrically connected to the first emission portion PA1, the second emission portion PA2, and the third emission portion PA3, respectively, and disposed to overlap the respective emission portions PA1, PA2 and PA3.

Although not illustrated, the respective circuit portions PC1, PC2 and PC3 may further include additional TFTs and capacitor as well as first to third driving TFTs T1, T2 and T3 electrically connected to the first electrodes 121a, 121b and 121c of the organic light-emitting device.

The first driving TFT T1 may include a first active layer 113a, a first gate electrode 115a, a first source electrode 118a, and a first drain electrode 117a, and the second driving TFT T2 may include a second active layer 113a, a second gate electrode 115b, a second source electrode 118b, and a second drain electrode 117b.

In detail, referring to FIG. 2, a buffer layer 112 is disposed on the substrate 111, and the first active layer 113a and the second active layer 113b are disposed on the buffer layer 112.

The buffer layer 112 serves to prevent penetration of impurities and perform surface planarization. The buffer layer 112 may be formed of various materials that perform such functions. For example, the buffer layer 112 may be formed of an inorganic material, such as silicon oxide, silicon nitride, silicon oxynitride, aluminum oxide, aluminum nitride, titanium oxide, and/or titanium nitride, and/or an organic material, such as polyimide, polyester, or acryl, and/or any stacks thereof. The buffer layer may be optionally omitted.

The active layers 113a and 113b may be formed to include various materials. For example, the active layers 113a and 113b may include an inorganic semiconductor material, such as amorphous silicon or crystalline silicon. As another example, the active layers 113a and 113b may include an oxide semiconductor. As another example, the active layers 113a and 113b may include organic semiconductor materials.

A gate insulating layer 114 is disposed on the buffer layer 112 to cover the active layers 113a and 113b, and gate electrodes 115a and 115b are disposed on the gate insulating layer 114.

An interlayer insulating layer 116 is disposed on the gate insulating layer 114 to cover the gate electrodes 115a and 115b. Source electrodes 118a and 118b and drain electrodes 117a and 117b are disposed on the interlayer insulating layer 116 and are electrically connected to the active layers 113a and 113b through contact holes.

A passivation layer 119 is disposed on the interlayer insulating layer 116 to cover the source electrodes 118a and 118b and the drain electrodes 117a and 117b. The drain electrodes 117a and 117b are electrically connected to the first electrodes 121a and 121b through via holes.

The structure of the TFTs T1 and T2 is not limited to the above examples, and various structures may also be applied to the TFTs T1 and T2.

Figure 3:
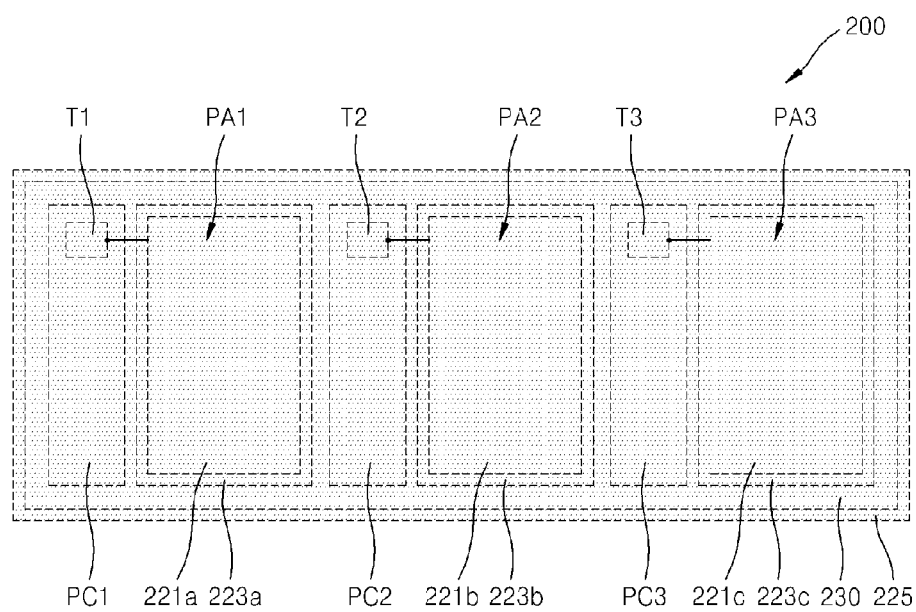
FIG. 3 is a schematic plan view of an organic light-emitting display apparatus according to an exemplary embodiment of the present invention.

FIG. 3 is a schematic plan view of an organic light-emitting display apparatus 200 according to an exemplary embodiment of the present invention.

Referring to FIG. 3, the organic light-emitting display apparatus 200 according to exemplary embodiments of the present invention includes a first emission portion PA1, a second emission portion PA2, and a third emission portion PA3. The emission portions PA1, PA2 and PA3 include first electrodes 221a, 221b and 221c, intermediate layers 223a, 223b and 223c emitting light of a first color, light of a second color, and light of a third color, and second electrodes 225, respectively.

The organic light-emitting display apparatus 200 according to an exemplary embodiment of the present invention may include a first circuit portion PC1, a second circuit portion PC2, and a third circuit portion PC3 electrically connected to the first emission portion PA1, the second emission portion PA2, and the third emission portion PA3, respectively, and disposed not to overlap the respective emission portions PA1, PA2 and PA3.

The circuit portions PC1, PC2 and PC3 include a plurality of TFTs, at least one capacitor, and wirings. The electrodes or wirings may be formed using only transparent materials, where desired.

In the organic light-emitting display apparatus 200 according to exemplary embodiments of the present invention, lights emitted from the intermediate layers 223a, 223b and 223c pass through the first electrodes 221a, 221b and 221c, are incident on the TFT array substrate (110 in FIG. 2), and are reflected by the optical member 230.

In this case, if the circuit portions PC1, PC2 and PC3 are disposed to overlap the emission portions PA1, PA2 and PA3, traveling light may be partially reflected by the electrodes and wirings, or a path of the light may be changed.

However, in the organic light-emitting display apparatus 200 according to exemplary embodiment of the present invention, since the circuit portions PC1, PC2 and PC3 are disposed not to overlap the emission portions PA1, PA2 and PA3, the electrodes or the like do not affect the path of the light. Hence, the optical efficiency and transmittance of the organic light-emitting display apparatus may be increased.

Figure 4:
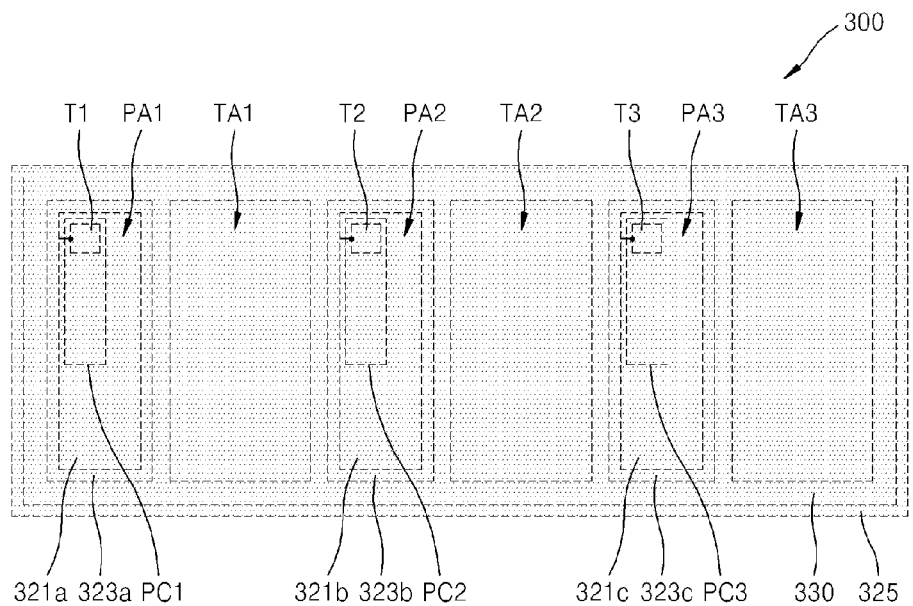
FIG. 4 is a schematic plan view of an organic light-emitting display apparatus according to an exemplary embodiment of the present invention.

FIG. 4 is a schematic plan view of an organic light-emitting display apparatus 300 according to an exemplary embodiment of the present invention.

Referring to FIG. 4, the organic light-emitting display apparatus 300 according to exemplary embodiments of the present invention includes a first emission portion PA1, a second emission portion PA2, and a third emission portion PA3. The emission portions PA1, PA2 and PA3 include first electrodes 321a, 321b and 321c, intermediate layers 323a, 323b and 323c emitting light of a first color, light of a second color, and light of a third color, and second electrodes 325, respectively.

The organic light-emitting display apparatus 300 according to exemplary embodiments of the present invention may include a first circuit portion PC1, a second circuit portion PC2, and a third circuit portion PC3 electrically connected to the first emission portion PA1, the second emission portion PA2, and the third emission portion PA3, respectively. The organic light-emitting display apparatus 300 according to exemplary embodiments of the present invention may further include a first transmission portion TA1 disposed between the first emission portion PA1 and the second emission portion PA2 and transmitting external light, a second transmission portion TA2 disposed between the second emission portion PA2 and the third emission portion PA3 and transmitting external light, and a third transmission portion TA3 disposed adjacent to the third emission portion PA3.

The first electrodes 321a, 321b and 321c and the intermediate layers 323a, 323b and 323c are not disposed in the transmission portions TA1, TA2 and TA3. The second electrodes 325 serve as a common electrode and extend to regions corresponding to the first transmission portion PA1, the second emission portion PA2, the third emission portion PA3, the first transmission portion TA1, the second transmission portion TA2, and the third transmission portion TA3.

Since the intermediate layers 323a, 323b and 323c are not disposed in the transmission portions TA1, TA2 and TA3, the transmission portions TA1, TA2 and TA3 do not emit light, but transmit external light. Therefore, the transmission portions TA1, TA2 and TA3 serve to increase the transmittance of the organic light-emitting display apparatus 300 with respect to the external light.

Although not illustrated, the second electrodes included in the organic light emitting display apparatus according to exemplary embodiments of the present invention may extend to regions corresponding to the first emission portion PA1, the second emission portion PA2, and the third emission portion PA3, and may include openings corresponding to the first transmission portion TA1, the second transmission portion TA2, and the third transmission portion TA3.

In addition, openings may be formed in the insulating layers (for example, the pixel defining layer 122 and the passivation layer 119) disposed in the regions corresponding to the first transmission portion TA1, the second transmission portion TA2, and the third transmission portion TA3.

In this manner, external light transmittance in the transmission portions TA1, TA2 and TA3 may be increased, and thus, the transmittance of the organic light-emitting display apparatus may be increased.

Figure 5:
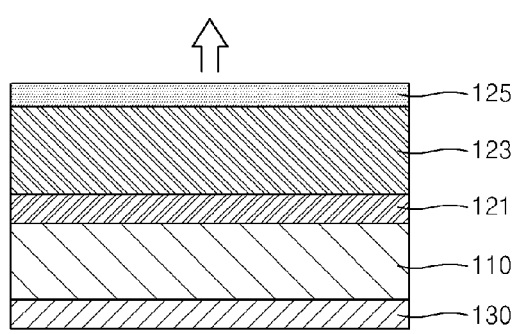
FIG. 5 is a schematic cross-sectional view of an organic light-emitting device according to an exemplary embodiment of the present invention.
Figure 6:
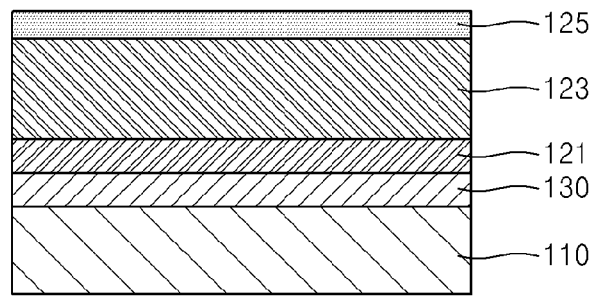
FIG. 6 is a schematic cross-sectional view of an organic light-emitting device according to an exemplary embodiment of the present invention.
Figure 7:
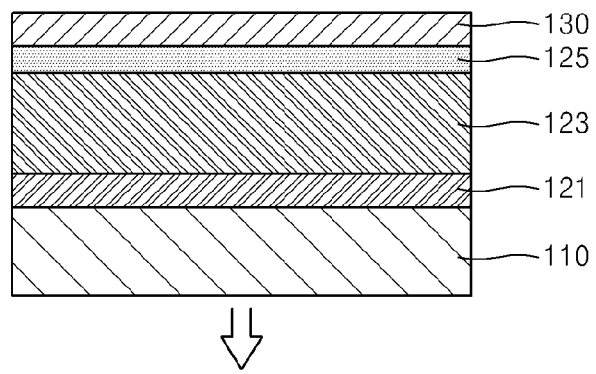
FIG. 7 is a schematic cross-sectional view of an organic light-emitting device according to an exemplary embodiment of the present invention.
Figure 8:
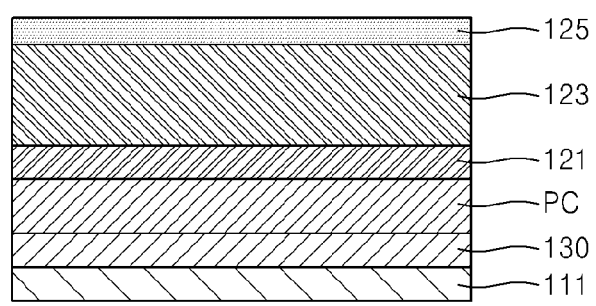
FIG. 8 is a schematic cross-sectional view of an organic light-emitting device according to an exemplary embodiment of the present invention.

FIG. 5 is a schematic cross-sectional view of a first organic light-emitting device according to an exemplary embodiment of the present invention. FIG. 6 is a schematic cross-sectional view of a second organic light-emitting device according to an exemplary embodiment of the present invention. FIG. 7 is a schematic cross-sectional view of a third organic light-emitting device according to an exemplary embodiment of the present invention. FIG. 8 is a schematic cross-sectional view of a fourth organic light-emitting device according to an exemplary embodiment of the present invention. Each of these first through fourth organic light-emitting devices represent different structures, however, exemplary embodiments of the present invention contemplate combining elements of these distinct organic light-emitting devices to produce additional embodiments.

Referring to FIG. 5, the first organic light-emitting device includes a first electrode 121, an intermediate layer 123, and a second electrode 125. An optical member 130 is disposed under the first electrode 121, and a substrate 110 is disposed between the first electrode 121 and the optical member 130.

The intermediate layer 123 may include an organic emission layer emitting a single color such as a red color, a green color, or a blue color. The optical member 130 may selectively reflect light of a wavelength corresponding to the color emitted from the organic emission layer.

Alternatively, the intermediate layer 123 may emit white light. The intermediate layer 123 emitting the white light may have various structures. For example, the intermediate layer 123 may have a stacked structure of at least a light-emitting material emitting red light, a light-emitting material emitting green light, and a light-emitting material emitting blue light.

As an example for emitting the white light, the intermediate layer 123 may have a combined structure of at least a light-emitting material emitting red light, a light-emitting material emitting green light, and a light-emitting material emitting blue light.

In this case, the optical member 130 may selectively reflect light of wavelengths corresponding to the red color, the green color, and the blue color.

The first electrode 121 and the second electrode 125 transmit light, and the optical member 130 functions as a reflection plate with respect to a particular color. Therefore, light may be finally emitted in a direction of the second electrode 125. For example, the organic light-emitting display apparatus including the first organic light-emitting device may be a top emission type display apparatus that implements an image in a direction of the second electrode 125.

Referring to FIG. 6, the second organic light-emitting device includes a first electrode 121, an intermediate layer 123, and a second electrode 125. An optical member 130 is disposed under the first electrode 121, and a substrate 110 is disposed under the optical member 130.

The first electrode 121 and the second electrode 125 transmit light. The optical member 130 may reflect only light of a particular wavelength among light emitted from the organic emission layer included in the intermediate layer 123, and may transmit lights of other wavelengths.

Here, since the light of the particular wavelength reflected from the optical member 130 is not incident in the substrate 101, the light may not be reflected by electrodes and wirings or the like that may be disposed in the substrate 101, and the path of the light may not be changed. Light loss may be reduced because a distance between the intermediate layer 123 and the optical member 130 is short.

Referring to FIG. 7, the third organic light-emitting device includes a first electrode 121, an intermediate layer 123, and a second electrode 125. A substrate 110 is disposed under the first electrode 121, and an optical member 130 is disposed on the second electrode 125. The substrate 110 may be a TFT array substrate including TFTs.

The first electrode 121 and the second electrode 125 transmit light, and the optical member 130 functions as a reflection plate with respect to a particular color. Therefore, the light may be finally emitted in a direction of the first electrode 121. For example, the organic light-emitting display apparatus including the organic light-emitting device 30 may be a bottom emission type display apparatus that implements an image in a direction of the first electrode 121.

Although not illustrated, an encapsulation layer may be disposed on the optical member 130 or between the second electrode 125 and the optical member 130.

Referring to FIG. 8, the fourth organic light-emitting device includes a first electrode 121, an intermediate layer 123, and a second electrode 125. A transparent substrate 111 and a circuit portion PC may be disposed under the first electrode 121, and an optical member 130 may be disposed between the transparent substrate 111 and the circuit portion PC.

Figure 9:
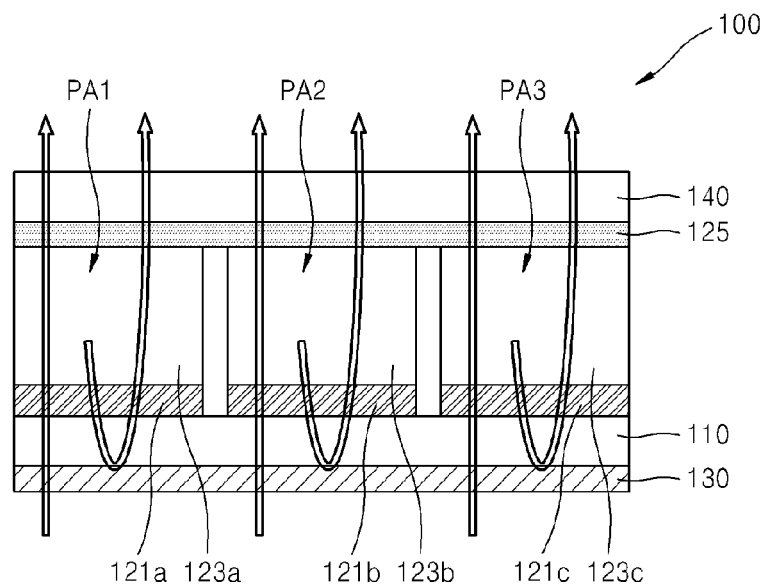
FIG. 9 is a schematic cross-sectional view illustrating an operation of the organic light-emitting display apparatus of FIG. 1.
Figure 10:
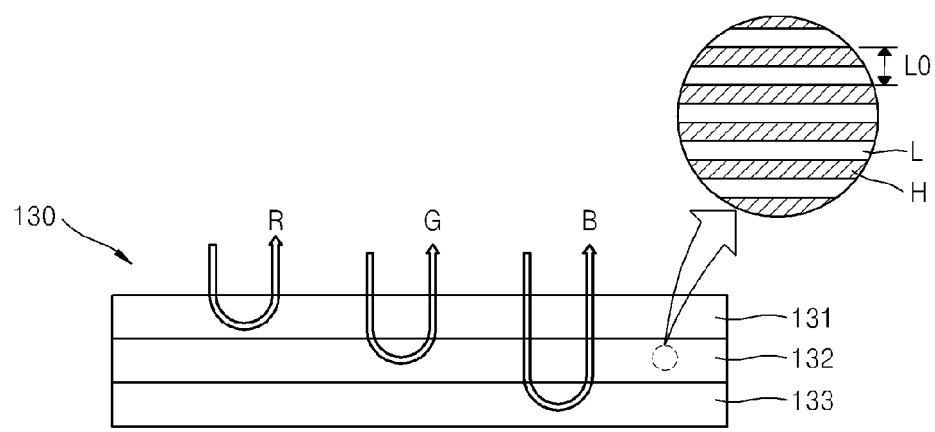
FIG. 10 is a schematic cross-sectional view of an optical member included in the organic light-emitting display apparatus of FIG. 1.
Figure 11:
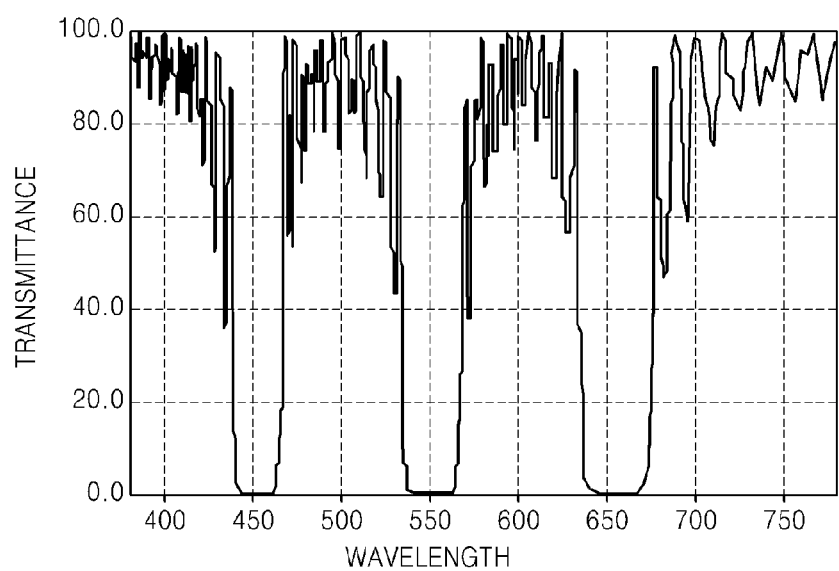
FIG. 11 is a graph illustrating a transmittance of the optical member of FIG. 10 with respect to a wavelength.

FIG. 9 is a schematic cross-sectional view illustrating an operation of the organic light-emitting display apparatus of FIG. 1, FIG. 10 is a schematic cross-sectional view of the optical member included in the organic light-emitting display apparatus of FIG. 1, and FIG. 11 is a graph illustrating a transmittance of the optical member of FIG. 10 with respect to a wavelength.

Referring to FIG. 9, the organic light-emitting display apparatus 100 according to an exemplary embodiment of the present embodiment includes a first emission portion PA1, a second emission portion PA2, and a third emission portion PA3. The transmission portions PA1, PA2 and PA3 may include first electrodes 121a, 121b and 121c, intermediate layers 123a, 123b and 123c, and a second electrode 125.

The first emission portion PA1, the second emission portion PA2, and the third emission portion PA3 may emit light of a first color, light of a second color, and light of a third color, respectively. The light of the first color, the light of the second color, and the light of the third color may be red light, green light, and blue light, respectively.

A substrate 110 is disposed under the emission portions PA1, PA2 and PA3, and an optical member 130 is disposed under the substrate 110. An encapsulation layer 140 may be disposed on the emission portions PA1, PA2 and PA3.

Referring to FIG. 10, the optical member 130 may include a first color light reflection portion 131, a second color light reflection portion 132, and a third color light reflection portion 133, and may include a high refractive index layer H and a low refractive index layer L stacked alternately in a repeating pattern.

The stacked structure of the high refractive index layer H and the low refractive index layer L may be formed using a block copolymer, which will be described below.

The high refractive index layer H and the low refractive index layer L may have a refractive index of about 1.3 to about 2.3, and a difference between the high refractive index layer H and the low refractive index layer L may be in the range of about 0.1 to about 1.

The optical member 130 may be designed to reflect only light of a particular wavelength. The optical member 130 may reflect light of a desired wavelength by adjusting a period ($L_0$) and a refractive index (n) according to Equation 1 below. The refractive index may be adjusted according to a difference of the refractive index between the high refractive index layer H and the low refractive index layer L and the number of stacks thereof.

$$L_0/2 = \lambda/4n \qquad \text{[Equation 1]}$$

FIG. 11 illustrates a transmittance of the optical member 130 with respect to a wavelength. In this case, a period ($L_0$) of the second color light reflection portion 132 is about 142 nm. Based on this, a period of the first color light reflection portion 131 is about 1.19 $L_0$, a period of the third color light reflection portion 133 is about 0.82 $L_0$, and each of the first to third color light reflection portions 131 to 133 has a total thickness of 3 μm.

For example, FIG. 11 is a simulation result showing the transmittance of the optical member 130 with respect to the wavelength in a condition satisfying the following optical structure.

$$\text{Glass}/0.82(LH)^m(LH)^n1.19(LH)^o/\text{Air}$$

where m, n and o represent the number of stacks of the high refractive index layer H and the low refractive index layer L included in the third color light reflection portion 133, the second color light reflection portion 132, and the first color light reflection portion 131, respectively, and may be calculated by dividing the total thickness (about 3 μm) by the period of the corresponding color light reflection portions 131, 132 and 133.

As can be seen from the graph, the optical member 130 has a transmission of about zero at about 450 nm corresponding to the blue color, about 550 nm corresponding to the green color, and about 650 nm corresponding to the red color. That is, the optical member 130 has high reflectance at only wavelengths corresponding to the blue color, the green color, and the red color, and has high transmittance with respect to lights of other wavelengths.

Even though a half-width of light emitted from the intermediate layers 123a, 123b and 123c is slightly wide, the optical member 130 selectively reflecting only light of a particular color serves as a filter. Therefore, the organic light-emitting display apparatus 100 according to exemplary embodiments of the present invention may emit light having a narrow half-width, for example, light having high color purity.

Referring again to FIGS. 9 and 10, the red light emitted from the first intermediate layer 123a included in the first emission portion PA1 may be reflected from the first color light reflection portion 131 of the optical member 130, the green light emitted from the second intermediate layer 123b included in the second emission portion PA2 may be reflected from the second color light reflection portion 132 of the optical member 130, and the blue light emitted from the third intermediate layer 123c included in the third emission portion PA3 may be reflected from the third color light reflection portion 133 of the optical member 130.

In this case, light other than the red light, the green light, and the blue light are not reflected but transmitted in the optical member 130. When viewed in a direction of the encapsulation layer 140, external light incident in a direction of the optical member 130 is directly transmitted. When viewing the organic light-emitting display apparatus 100, a background disposed on a backside of the organic light-emitting display apparatus 100 is viewed as it is. Therefore, it is possible to implement the transparent organic light-emitting display apparatus 100 with high transmittance.

In addition, since only the light of the particular color is selectively reflected by the optical member 130, it is possible to implement the organic light-emitting display apparatus 100 with increased color purity.

The optical member 130 of the organic light-emitting display apparatus 100 of FIG. 9 is disposed in an entire surface to correspond to the first emission portion PA1, the second emission portion PA2, and the third emission portion PA3, but the present invention is not limited thereto. The optical member of the organic light-emitting display apparatus according to exemplary embodiments of the present invention may be disposed in an island shape to correspond to the first emission portion PA1, the second emission portion PA2, and the third emission portion PA3. In this case, the optical member may be designed to reflect only light of the wavelength emitted from the emission portion disposed in the corresponding region.

Figure 12:
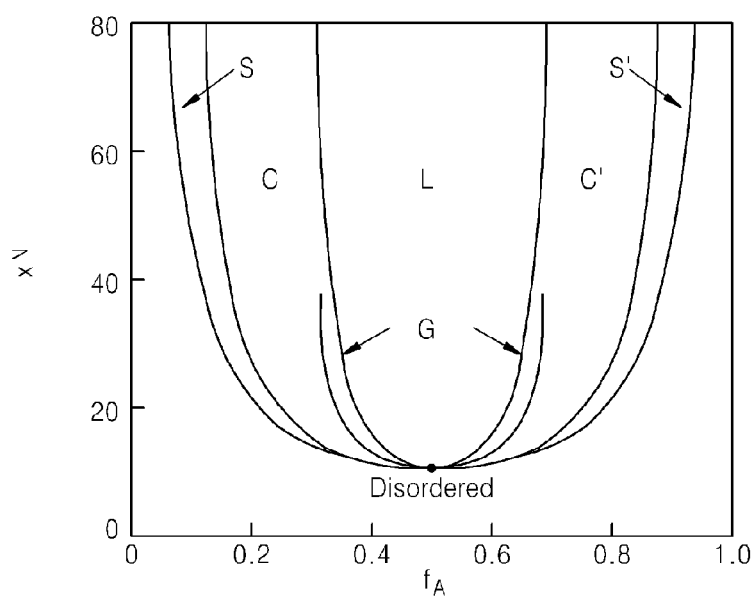
FIG. 12 is a phase equilibrium diagram of a block copolymer.
Figure 13:
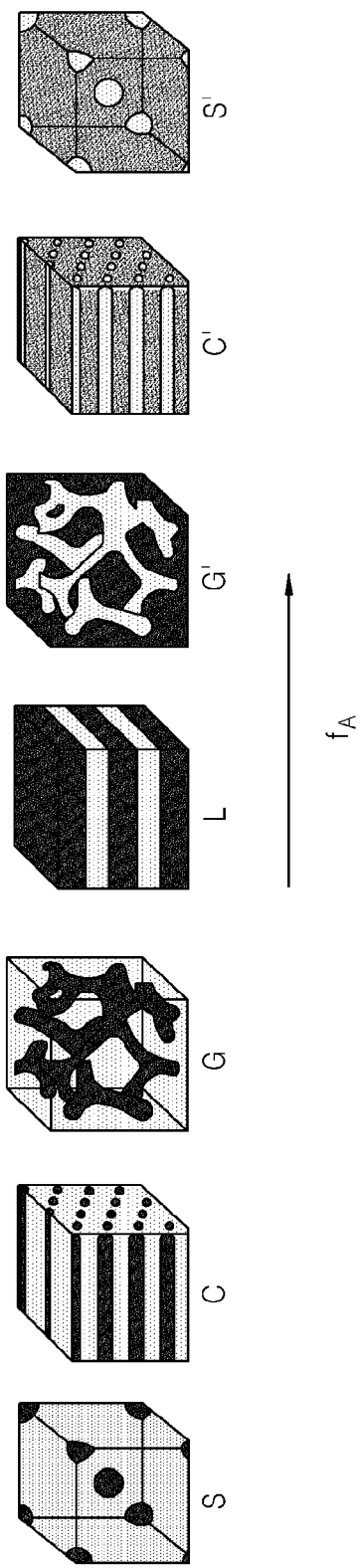
FIG. 13 is a schematic diagram of nanostructures according to a volume ratio of the block copolymer of FIG. 12.
Figure 14:
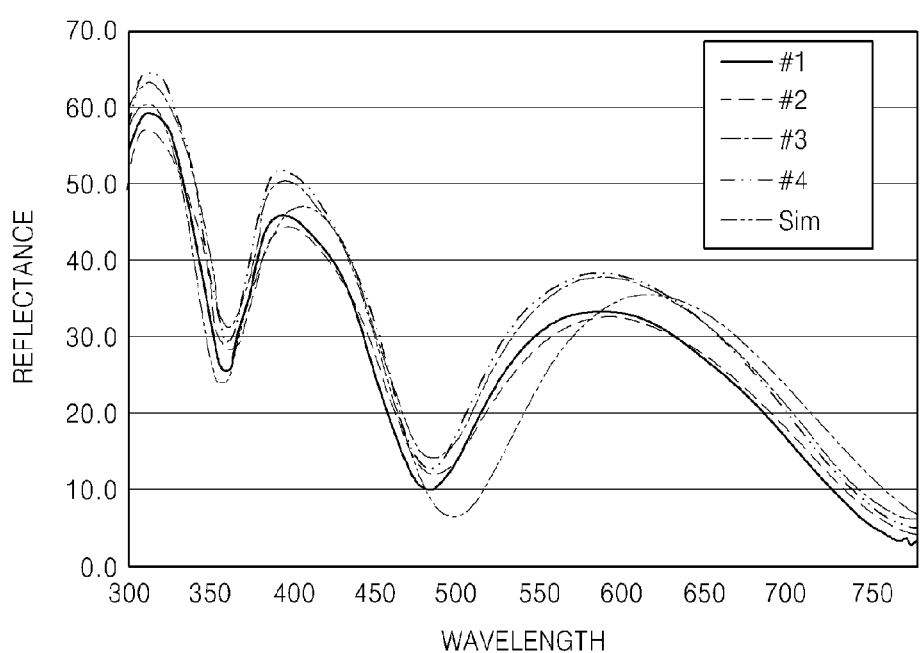
FIG. 14 is a graph illustrating a reflectance of the optical member including the block copolymer of FIG. 12 with respect to a wavelength.

FIG. 12 is a phase equilibrium diagram of a block copolymer, FIG. 13 is a schematic diagram of nanostructures according to a volume ratio of the block copolymer of FIG. 12, and FIG. 14 is a graph illustrating a reflectance of the optical member including the block copolymer of FIG. 12 with respect to a wavelength.

The optical members 130, 230 and 330 included in the organic light-emitting display apparatuses 100, 200 and 300 according to exemplary embodiments of the present invention may include a block copolymer.

The block copolymer refers to a polymer formed by linearly connecting a plurality of blocks in such a manner that a block is formed by polymerizing one type of monomer and a block is formed by polymerizing another type of monomer.

The block copolymer may include polystyrene-block-poly (methylmethacrylate) (PS-b-PMMA), polystyrene-block-poly(ethylene oxide) (PS-b-PEO), polystyrene-block-poly (vinyl pyridine) (PS-b-PVP), polystyrene-block-poly (ethylene-alt-propylene) (PS-b-PEP), and/or polystyrene-block-polyisoprene (PS-b-PI), and may have a self-assembly characteristic.

FIG. 12 is a phase equilibrium diagram of PS-b-PMMA. PS-b-PMMA includes two materials, for example, a high refractive index material and a low refractive index material. In the phase equilibrium diagram, a horizontal axis $f_A$ represents a volume ratio of the high refractive index material with respect to a total volume, and a vertical axis ($\chi n$) represents the product of a repulsive force ($\chi$) and a degree of polymerization (N).

FIG. 13 illustrates various nanostructures of the PS-b-PMMA according to the volume ratio $f_A$. In a region L of FIG. 12, a nanostructure, in which two materials, for example, a high refractive index material and a low refractive index material, are alternately and repeatedly stacked as illustrated in FIG. 13, is formed.

The stacked structure of the high refractive index material and the low refractive index material may also be applied to the optical members 100, 200 and 300 included in the organic light-emitting display apparatuses 100, 200 and 300 according to exemplary embodiments of the present invention.

Referring to FIG. 14, after the nanostructure of the block copolymer is stacked on the substrate, the reflectance according to the wavelength is measured. A simulation result Sim and measured results #1, #2, #3 and #4 are compared with one another.

In this case, the simulation may be performed under the following conditions: the high refractive index layer H has a refractive index of 1.7 and a thickness of 31.887 nm, the low refractive index layer L has a refractive index of 1.5 and a thickness of 31.887, a total thickness thereof is 382.64 nm, an optical structure is $L(HL)^5H$, a block copolymer used in the experiment is PS-b-PMMA, and a period $L_0$ thereof is 62 nm.

The measured result may be similar to the simulation result. This represents that the nanostructure of the block copolymer has a desired optical structure, for example, a stacked structure of a high refractive index layer and a low refractive index layer, and an optical member can be formed using the block copolymer.

As described above, the organic light-emitting display apparatuses according to exemplary embodiments of the present invention may be configured to transmit light, without employing the reflection film in the first electrode or the second electrode. In addition, by employing the optical member reflecting only lights of particular colors, the transmittance and color purity of the organic light-emitting display apparatuses may be increased, and light loss may be reduced.

Moreover, the optical member may be formed using the block copolymer.

As described above, the organic light-emitting display apparatuses may reduce light loss and may have high transmittance and color purity.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention.

What is claimed is:

1. An organic light-emitting display apparatus comprising:
   a first emission portion comprising a first intermediate layer, a first electrode disposed on a first surface of the first intermediate layer and transmits light emitted from the first intermediate layer, and a second electrode disposed on a second surface of the first intermediate layer that faces the first surface of the first intermediate layer and transmits light emitted from the first intermediate layer, the first emission portion being configured to emit light of a first color; and
   an optical member disposed on a first surface of the first emission portion and selectively reflecting lights of particular colors including at least the first color,
   wherein an image is displayed toward an opposite direction of a direction which the optical member is disposed from the first emission portion, and
   wherein the optical member comprises a high refractive index layer and a low refractive index layer that are alternately and repeatedly stacked.

2. The organic light-emitting display apparatus of claim 1, further comprising:
   a second emission portion, disposed adjacent to the first emission portion, without overlapping the first emission portion, comprises a second intermediate layer, the second emission portion being configured to emit light of a second color; and
   a third emission portion, disposed adjacent to the second emission portion, without overlapping the first emission portion and the second emission portion, comprises a third intermediate layer, the third emission portion being configured to emit light of a third color,
   wherein the optical member extends from the first emission portion to the second emission portion and the third emission portion, and selectively reflects the light of the first color, the light of the second color, and the light of the third color.

3. The organic light-emitting display apparatus of claim 2, wherein the optical member comprises a first color light reflection portion, a second color light reflection portion, and a third color light reflection portion.

4. The organic light-emitting display apparatus of claim 2, further comprising a first circuit portion, a second circuit portion, and a third circuit portion electrically connected to the first emission portion, the second emission portion, and the third emission portion, respectively,
wherein none of the first circuit portion, the second circuit portion, and the third circuit portion are disposed to overlap any of the first emission portion, the second emission portion, or the third emission portion.

5. The organic light-emitting display apparatus of claim 2, further comprising a first circuit portion, a second circuit portion, and a third circuit portion electrically connected to the first emission portion, the second emission portion, and the third emission portion, respectively,
wherein the first circuit portion, the second circuit portion, and the third circuit portion are disposed to overlap the first emission portion, the second emission portion, and the third emission portion, respectively.

6. The organic light-emitting display apparatus of claim 2, further comprising:
a first transmission portion, disposed between the first emission portion and the second emission portion, transmitting external light; and
a second transmission portion, disposed between the second emission portion and the third emission portion, emitting external light.

7. The organic light-emitting display apparatus of claim 2, wherein the first color, the second color, and the third color correspond to a red color, a green color, and a blue color, respectively.

8. The organic light-emitting display apparatus of claim 6, wherein the second electrode extends to regions corresponding to the second emission portion, the third emission portion, the first transmission portion, and the second transmission portion.

9. The organic light-emitting display apparatus of claim 6, wherein the second electrode extends to regions corresponding to the second emission portion and the third emission portion, and comprises openings corresponding to the first transmission portion and the second transmission portion.

10. The organic light-emitting display apparatus of claim 1, wherein the first electrode comprises indium tin oxide (ITO), indium zinc oxide (IZO), zinc oxide (ZnO), indium oxide ($In_2O_3$), indium gallium oxide (IGO), or aluminum zinc oxide (AZO) as a material transmitting the light emitted from the first emission portion, and
the second electrode comprises a magnesium (Mg) thin film, a silver (Ag) thin film, or an Mg:Ag thin film as a material transmitting light emitted from the first emission portion.

11. The organic light-emitting display apparatus of claim 1, wherein a substrate is disposed on an opposite surface to a surface of the first electrode where the first intermediate layer is disposed, and the optical member is disposed between the first electrode and the substrate.

12. The organic light-emitting display apparatus of claim 1, wherein a thin film transistor (TFT) array substrate is disposed on an opposite surface to a surface of the first electrode where the first intermediate layer is disposed,
the TFT array substrate comprises a transparent substrate and a circuit portion, the circuit portion being disposed on the transparent substrate and comprising a TFT, and
the optical member is disposed between the transparent substrate and the circuit portion.

13. The organic light-emitting display apparatus of claim 1, wherein a TFT array substrate is disposed on an opposite surface to a surface of the first electrode where the first intermediate layer is disposed, and
the optical member is disposed on an opposite surface to a surface of the second electrode where the first intermediate layer is disposed.

14. The organic light-emitting display apparatus of claim 1, wherein the high refractive index layer and the low refractive index layer each have a refractive index of about 1.3 to about 2.3, and a difference of the refractive index between the high refractive index layer and the low refractive index layer is in a range of about 0.1 to about 1.

15. The organic light-emitting display apparatus of claim 1, wherein the optical member comprises a block copolymer.

16. The organic light-emitting display apparatus of claim 15, wherein the block copolymer includes polystyrene-block-poly(methylmethacrylate) (PS-b-PMMA), polystyrene-block-poly(ethylene oxide) (PS-b-PEO), polystyrene-block-poly(vinyl pyridine) (PS-b-PVP), polystyrene-block-poly(ethylene-alt-propylene) (PS-b-PEP), or polystyrene-block-polyisoprene (PS-b-PI).

17. An organic light-emitting display apparatus comprising:
a first emission portion comprising a first intermediate layer, a first electrode disposed on a first surface of the first intermediate layer and transmits light emitted from the first intermediate layer, and a second electrode disposed on a second surface of the first intermediate layer that faces the first surface of the first intermediate layer and transmits light emitted from the first intermediate layer, the first emission portion being configured to emit light of a first color; and
an optical member disposed on a first surface of the first emission portion and selectively reflecting lights of particular colors including at least the first color,
wherein an image is displayed toward an opposite direction of a direction which the optical member is disposed from the first emission portion, and
wherein a substrate is disposed between the first electrode and the optical member.

18. A transparent organic light-emitting display apparatus, comprising:
a first light emission portion emitting light of a first color and having electrodes that are substantially transparent;
a second light emission portion emitting light of a second color and having electrodes that are substantially transparent;
a third light emission portion emitting light of a third color and having electrodes that are substantially transparent,
wherein the first, second and third light emission portions are separated from each other by a plurality of pixel defining layers and the first, second and third light emission portions do not overlap each other; and
an optical member disposed below the first, second, and third light emission portions,
wherein the optical member is configured to reflect substantially all light of the first, second and third color and transmit substantially all light of colors other than the first, second or third color, and wherein an image is displayed toward an opposite direction of a direction which the optical member is disposed from the first emission portion; and wherein a substrate layer is disposed between the optical member and at least one electrode of the electrodes of each of the first, second, and third light emission portions.

* * * * *